(12) United States Patent
Wada et al.

(10) Patent No.: US 9,559,217 B2
(45) Date of Patent: Jan. 31, 2017

(54) SILICON CARBIDE SEMICONDUCTOR DEVICE

(71) Applicant: Sumitomo Electric Industries, Ltd., Osaka-shi (JP)

(72) Inventors: Keiji Wada, Osaka (JP); Kenji Kanbara, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/892,163

(22) PCT Filed: Apr. 2, 2014

(86) PCT No.: PCT/JP2014/059726
§ 371 (c)(1),
(2) Date: Nov. 18, 2015

(87) PCT Pub. No.: WO2014/188794
PCT Pub. Date: Nov. 27, 2014

(65) Prior Publication Data
US 2016/0093749 A1 Mar. 31, 2016

(30) Foreign Application Priority Data
May 21, 2013 (JP) .................................. 2013-107133

(51) Int. Cl.
*H01L 29/87* (2006.01)
*H01L 29/872* (2006.01)
(Continued)

(52) U.S. Cl.
CPC ........... *H01L 29/872* (2013.01); *H01L 21/046* (2013.01); *H01L 21/0495* (2013.01);
(Continued)

(58) Field of Classification Search
CPC ..... H01L 29/872; H01L 29/1608; H01L 29/47
See application file for complete search history.

(56) References Cited

U.S. PATENT DOCUMENTS

| | | |
|---|---|---|
| 5,017,976 A | 5/1991 | Sugita |
| 2003/0067033 A1 | 4/2003 | Kinoshita et al. |

(Continued)

FOREIGN PATENT DOCUMENTS

| | | |
|---|---|---|
| JP | 02-151067 A | 6/1990 |
| JP | 03-185870 A | 8/1991 |

(Continued)

OTHER PUBLICATIONS

Choi et al. "tapered Sidewall Schottky Dodes with Very Low Taper Angles," Japanese Jounral of Applied Physics vol. 22 p. 137-140 1983.*

(Continued)

*Primary Examiner* — Matthew Reames
(74) *Attorney, Agent, or Firm* — Venable LLP; Michael A. Sartori; Frank B. Riggs

(57) ABSTRACT

A silicon carbide semiconductor device includes a silicon carbide layer, an insulating layer, a Schottky electrode, and a reaction region. The silicon carbide layer includes a p type region in contact with a first main surface and an n type region in contact with the p type region and the first main surface. The insulating layer has a third main surface, a fourth main surface, and a side wall surface connecting the third main surface and the fourth main surface, and is in contact with the first main surface at the fourth main surface. The Schottky electrode is in contact with the first main surface and the side wall surface. The reaction region is in contact with the insulating layer, the Schottky electrode, and the p type region. The reaction region contains an element constituting the Schottky electrode, an element constituting the insulating layer, silicon, and carbon.

8 Claims, 7 Drawing Sheets

(51) Int. Cl.

| | | |
|---|---|---|
| H01L 29/36 | (2006.01) | |
| H01L 29/06 | (2006.01) | |
| H01L 29/16 | (2006.01) | |
| H01L 21/04 | (2006.01) | |
| H01L 29/66 | (2006.01) | |
| H01L 29/47 | (2006.01) | |

(52) U.S. Cl.
CPC ...... *H01L 29/0619* (2013.01); *H01L 29/1608* (2013.01); *H01L 29/36* (2013.01); *H01L 29/47* (2013.01); *H01L 29/6606* (2013.01)

(56) References Cited

U.S. PATENT DOCUMENTS

2012/0223332 A1    9/2012    Kamaga et al.
2012/0228633 A1    9/2012    Hatakeyama
2014/0203299 A1    7/2014    Aketa et al.
2015/0056786 A1*   2/2015    Kinoshita ............... H01L 29/47
                                                     438/478

FOREIGN PATENT DOCUMENTS

| JP | 2003-101039 A | 4/2003 |
| JP | 2008-251772 A | 10/2008 |
| JP | 2010-068008 A | 3/2010 |
| JP | 2012-069567 A | 4/2012 |
| JP | 2012-182405 A | 9/2012 |
| JP | 2012-190983 A | 10/2012 |
| JP | 2013-030618 A | 2/2013 |

OTHER PUBLICATIONS

International Search Report in PCT International Application No. PCT/JP2014/059726, dated Jun. 10, 2014.

* cited by examiner

SILICON CARBIDE SEMICONDUCTOR DEVICE

TECHNICAL FIELD

The present invention relates to a silicon carbide semiconductor device, and more particularly to a silicon carbide semiconductor device including a Schottky electrode.

BACKGROUND ART

In recent years, in order to achieve high breakdown voltage, low loss, and utilization under a high temperature environment of semiconductor devices such as a Schottky barrier diode (hereafter referred to as an SBD), silicon carbide has begun to be adopted as a material for a semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like. Further, the semiconductor device thus adopting silicon carbide as its material has characteristics less deteriorated even under a high temperature environment than those of a semiconductor device adopting silicon as its material, advantageously.

For example, Japanese Patent Laying-Open No. 3-185870 (PTD 1) describes an SBD made of silicon, having an insulating film with a taper formed on an n type layer, and an electrode film in contact with the taper portion and the n type layer. Japanese Patent Laying-Open No. 3-185870 also describes that, when the insulating film is formed to be tapered, it is easy to alleviate an electric field, but it is difficult to obtain a high breakdown voltage.

Further, Japanese Patent Laying-Open No. 2-151067 (PTD 2) discloses a junction barrier Schottky diode (hereafter referred to as a JBS) made of silicon, having PN junctions selectively provided in contact with a barrier metal. The JBS is formed to prevent depletion layers formed by adjacent PN junctions from coupling with each other and interrupting a forward current at the time of forward bias, and is configured such that the depletion layers formed by the adjacent PN junctions couple with each other and interrupt a reverse leakage current at the time of reverse bias.

Furthermore, Japanese Patent Laying-Open No. 2003-101039 (PTD 3) describes an SBD made of silicon carbide, having an insulating film, an electrode, a field plate which is in contact with a surface of the insulating film and is electrically connected with the electrode, an edge termination layer, a RESURF layer, and a guard ring layer. Japanese Patent Laying-Open No. 2003-101039 describes that, by forming the guard ring layer having a low impurity concentration comparable to that of the RESURF layer around the RESURF layer, the guard ring can serve to suppress a reduction in breakdown voltage when the impurity concentration of the RESURF layer is higher than an optimum value.

CITATION LIST

Patent Document

PTD 1: Japanese Patent Laying-Open No. 3-185870
PTD 2: Japanese Patent Laying-Open No. 2-151067
PTD 3: Japanese Patent Laying-Open No. 2003-101039

SUMMARY OF INVENTION

Technical Problem

However, in the semiconductor devices described in Japanese Patent Laying-Open Nos. 3-185870, 2-151067, and 2003-101039, there have been cases where the breakdown voltage of the semiconductor device deteriorates as time passes.

The present invention has been made in view of the aforementioned problem, and one object of the present invention is to provide a silicon carbide semiconductor device which can have a high breakdown voltage and can suppress over-time deterioration of the breakdown voltage.

Solution to Problem

A silicon carbide semiconductor device in accordance with the present invention includes a silicon carbide layer, an insulating layer, a Schottky electrode, and a reaction region. The silicon carbide layer has a first main surface and a second main surface opposite to the first main surface, and includes a p type region in contact with the first main surface and an n type region in contact with the p type region and the first main surface. The insulating layer has a third main surface, a fourth main surface opposite to the third main surface, and a side wall surface connecting the third main surface and the fourth main surface, and is in contact with the first main surface at the fourth main surface. The Schottky electrode is in contact with the first main surface and the side wall surface. The reaction region is in contact with the insulating layer, the Schottky electrode, and the p type region. The reaction region contains an element constituting the Schottky electrode, an element constituting the insulating layer, silicon, and carbon.

Advantageous Effects of Invention

According to the present invention, a silicon carbide semiconductor device which can have a high breakdown voltage and can suppress over-time deterioration of the breakdown voltage can be provided.

DESCRIPTION OF EMBODIMENTS

Figure 1:
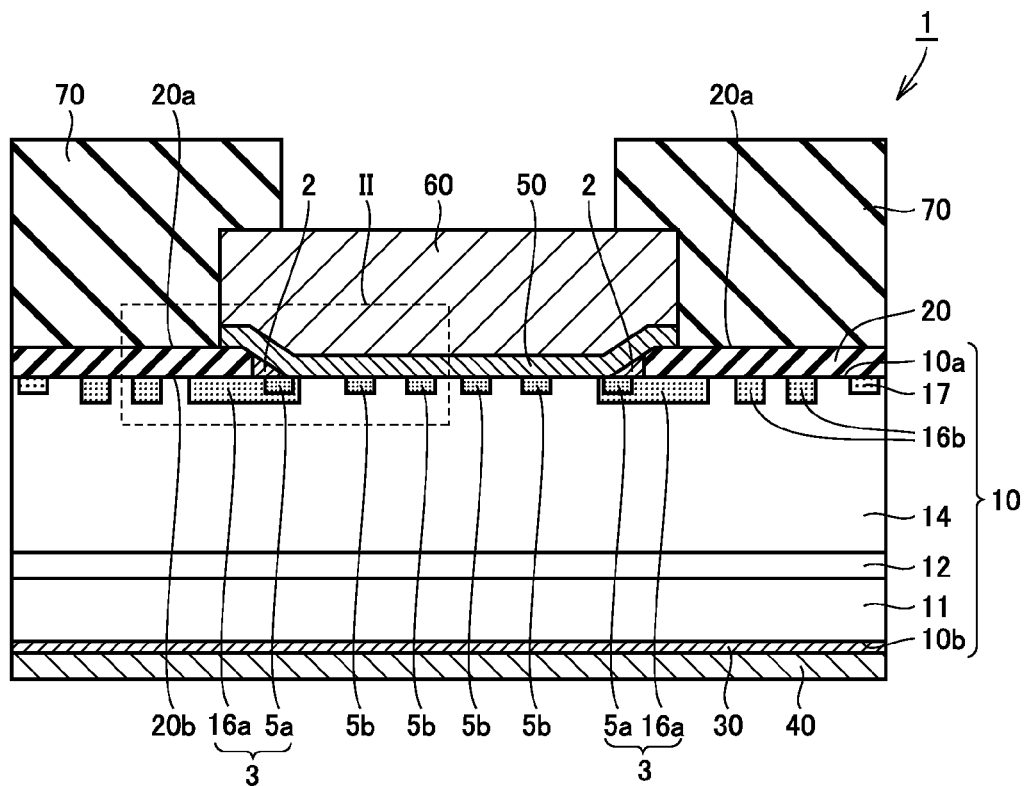
FIG. 1 is a schematic cross sectional view schematically showing a structure of a silicon carbide semiconductor device in accordance with one embodiment of the present invention.

Hereinafter, an embodiment of the present invention will be described with reference to the drawings. It is noted that identical or corresponding parts in the drawings will be designated by the same reference numerals, and the description thereof will not be repeated.

First, a summary of an embodiment of the present invention will be described.

As a result of earnest studies on methods for suppressing over-time deterioration of the breakdown voltage of silicon carbide semiconductor devices, the inventors have obtained the following findings and found the present invention. When a high voltage such as for example a surge voltage is applied to a silicon carbide semiconductor device such as for example an SBD, a high electric field is applied to a region where a Schottky electrode, an insulating layer, and a silicon carbide layer are in contact with each other. When the high electric field is applied to that region, hard breakdown accompanied by physical destruction may be caused. Further, even though not accompanied by physical destruction, insulation properties of the insulating layer may deteriorate as time passes. Since the deterioration of the insulation properties of the insulating film may cause a change (increase) in leakage current, the breakdown voltage of the silicon carbide semiconductor device deteriorates as time passes. In other words, reliability of the breakdown voltage of a silicon carbide semiconductor element is impaired.

Thus, a current path for a reverse direction voltage is intentionally formed by providing a reaction region which is in contact with the silicon carbide layer with a low resistance, in the region where the Schottky electrode, the insulating layer, and the silicon carbide layer are in contact with each other. This can alleviate concentration of the electric field on the region where the Schottky electrode, the insulating layer, and the silicon carbide layer are in contact with each other. Thus, this can suppress over-time deterioration of the insulation properties of the insulating layer. Further, a high breakdown voltage can be obtained by providing a p type region which is in contact with the reaction region, in the silicon carbide layer. As a result, a silicon carbide semiconductor device which can have a high breakdown voltage and can suppress over-time deterioration of the breakdown voltage can be obtained.

A silicon carbide semiconductor device 1 in accordance with the embodiment includes a silicon carbide layer 10, an insulating layer 20, a Schottky electrode 50, and a reaction region 2. Silicon carbide layer 10 has a first main surface 10a and a second main surface 10b opposite to first main surface 10a, and includes a p type region 3 in contact with first main surface 10a and an n type region 14 in contact with p type region 3 and first main surface 10a. Insulating layer 20 has a third main surface 20a, a fourth main surface 20b opposite to third main surface 20a, and a side wall surface 20c connecting third main surface 20a and fourth main surface 20b, and is in contact with first main surface 10a at fourth main surface 20b. Schottky electrode 50 is in contact with first main surface 10a and side wall surface 20c. Reaction region 2 is in contact with insulating layer 20, Schottky electrode 50, and p type region 3. Reaction region 2 contains an element constituting Schottky electrode 50, an element constituting insulating layer 20, silicon, and carbon.

Silicon carbide semiconductor device 1 in accordance with the embodiment has reaction region 2 which is in contact with insulating layer 20, Schottky electrode 50, and p type region 3, and reaction region 2 contains an element constituting Schottky electrode 50, an element constituting insulating layer 20, silicon, and carbon. This can alleviate concentration of an electric field on reaction region 2 where insulating layer 20, Schottky electrode 50, and p type region 3 of silicon carbide layer 10 are in contact with each other. Thus, this can suppress over-time deterioration of insulation properties of insulating layer 20. Further, since p type region 3 in contact with reaction region 2 is provided in silicon carbide layer 10, a high breakdown voltage can be obtained. As a result, silicon carbide semiconductor device 1 in accordance with the embodiment can have a high breakdown voltage, and can suppress over-time deterioration of the breakdown voltage.

Preferably, in silicon carbide semiconductor device 1 in accordance with the embodiment described above, side wall surface 20c of insulating layer 20 is inclined with respect to first main surface 10a of silicon carbide layer 10. Since this can facilitate formation of reaction region 2, this can effectively alleviate concentration of the electric field on reaction region 2 where insulating layer 20, Schottky electrode 50, and p type region 3 of silicon carbide layer 10 are in contact with each other.

Preferably, in silicon carbide semiconductor device 1 in accordance with the embodiment described above, an angle θ formed between side wall surface 20c and first main surface 10a is more than or equal to 10° and less than or equal to 60°. Here, angle θ formed between side wall surface 20c and first main surface 10a refers to angle θ formed between a surface parallel to side wall surface 20c and first main surface 10a. Since this can reduce a leakage current in reaction region 2, this can improve the breakdown voltage of silicon carbide semiconductor device 1. If angle θ is less than 10°, the leakage current is increased and the breakdown voltage of silicon carbide semiconductor device 1 is reduced. On the other hand, if angle θ is more than 60°, it is difficult to facilitate the formation of reaction region 2. By setting angle θ to more than or equal to 10° and less than or equal to 60°, a reduction in the breakdown voltage of silicon carbide semiconductor device 1 can be suppressed, and the formation of reaction region 2 can be facilitated.

Preferably, in silicon carbide semiconductor device 1 in accordance with the embodiment described above, a contact resistance between p type region 3 of silicon carbide layer 10 and reaction region 2 is less than or equal to 0.1 Ωcm². This can alleviate concentration of the electric field on reaction region 2 where insulating layer 20, Schottky electrode 50, and p type region 3 of silicon carbide layer 10 are in contact with each other. As a result, this can effectively suppress over-time deterioration of the breakdown voltage of silicon carbide semiconductor device 1.

Preferably, in silicon carbide semiconductor device 1 in accordance with the embodiment described above, when viewed in a plan view, p type region 3 includes an inner end portion 3a and an outer end portion 3b opposite to inner end portion 3a. When viewed in a plan view, reaction region 2 is located between inner end portion 3a and outer end portion 3b. This can improve the breakdown voltage of silicon carbide semiconductor device 1.

Preferably, silicon carbide semiconductor device 1 in accordance with the embodiment described above further includes a guard ring region 16b arranged to surround p type region 3 when viewed in a plan view. This can effectively improve the breakdown voltage of silicon carbide semiconductor device 1.

Preferably, in silicon carbide semiconductor device 1 in accordance with the embodiment described above, insulating layer 20 contains silicon dioxide. Thereby, reaction region 2 in contact with silicon carbide layer 10 with a low resistance can be formed effectively.

Preferably, in silicon carbide semiconductor device 1 in accordance with the embodiment described above, Schottky electrode 50 contains at least one element selected from the group consisting of titanium, molybdenum, nickel, gold, and tungsten. Thereby, reaction region 2 in contact with silicon carbide layer 10 with a low resistance can be formed effectively.

Next, the embodiment of the present invention will be described in more detail.

First, a structure of a JBS as a silicon carbide diode in accordance with a first embodiment of the present invention will be described with reference to FIGS. 1 to 4.

Figure 2:
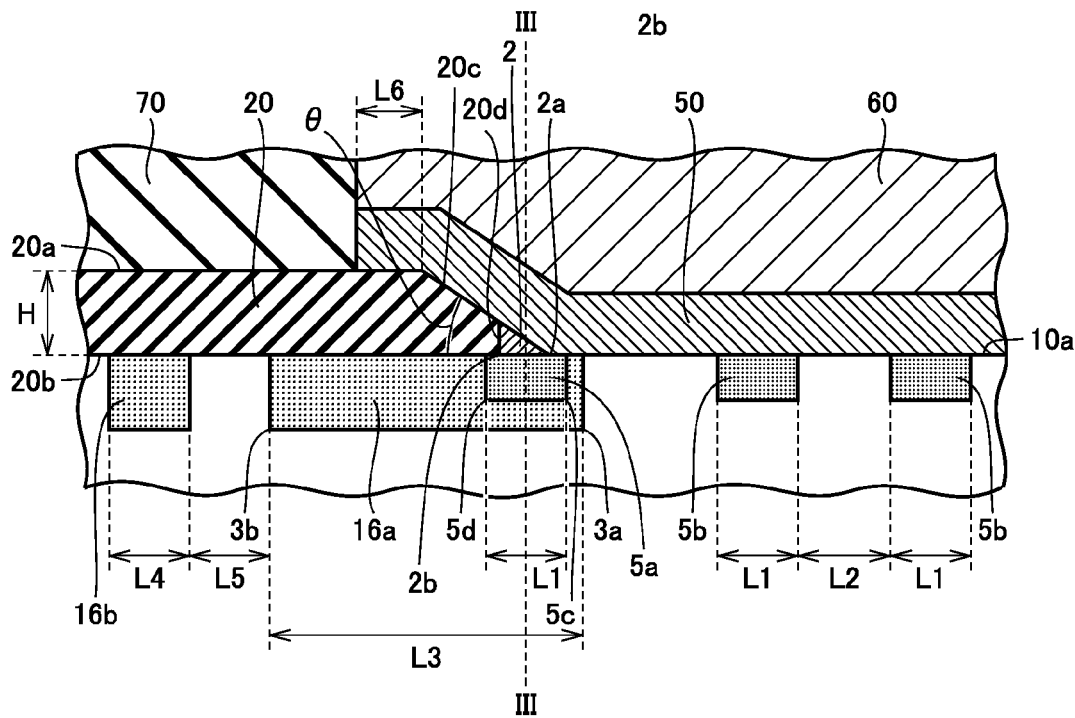
FIG. 2 is an enlarged view of a region II in FIG. 1.

As shown in FIGS. 1 and 2, a JBS 1 of the present embodiment mainly has silicon carbide layer 10, Schottky electrode 50, insulating layer 20, reaction region 2, an ohmic electrode 30, an upper wire 60, a pad electrode 40, and a protective film 70. Silicon carbide layer 10 is made of, for example, hexagonal silicon carbide having a polytype of 4H, and has n type. Silicon carbide layer 10 has first main surface 10a and second main surface 10b facing each other.

Silicon carbide layer 10 includes first p type region 3, a second p type region 5b, a field stop region 17, an n+ substrate 11, an electric field stop layer 12, and n type region 14. First p type region 3 is a p type region in which ions of an impurity such as for example aluminum (Al) or boron (B) are implanted. First p type region 3 may have a third p type region 5a, and a fourth p type region 16a having an impurity concentration lower than that of third p type region 5a. Third p type region 5a has an impurity concentration of, for example, about $1 \times 10^{19}$ cm$^{-3}$, and fourth p type region 16a has an impurity concentration of, for example, more than or equal to about $1 \times 10^{17}$ cm$^{-3}$ and less than or equal to about $3 \times 10^{17}$ cm$^{-3}$. Silicon carbide layer 10 has second p type region 5b which is surrounded by first p type region 3 when viewed in a plan view (field of view seen from the direction of the normal to first main surface 10a), and is in contact with first main surface 10a when viewed in a cross sectional view (field of view in the direction parallel to first main surface 10a). Second p type region 5b is a p type region in which ions of an impurity such as for example aluminum (Al) or boron (B) are implanted. The impurity concentration of second p type region 5b is almost the same as that of third p type region 5a. Each of first p type region 3, second p type region 5b, and guard ring region 16b has a depth of, for example, more than or equal to about 0.2 μm and less than or equal to about 0.3 μm, in a direction perpendicular to first main surface 10a.

Silicon carbide layer 10 may have guard ring region 16b which surrounds first p type region 3 when viewed in a plan view, and is in contact with first main surface 10a when viewed in a cross sectional view. Guard ring region 16b is a p type region in which ions of an impurity such as for example aluminum (Al) or boron (B) are implanted. The impurity concentration of guard ring region 16b is, for example, more than or equal to about $1 \times 10^{17}$ cm$^{-3}$ and less than or equal to about $3 \times 10^{17}$ cm$^{-3}$. Silicon carbide layer 10 may have field stop region 17 which surrounds guard ring region 16b when viewed in a plan view, and is in contact with first main surface 10a when viewed in a cross sectional view. Field stop region 17 is an n type region in which ions of an impurity such as for example phosphorus (P) are implanted. The impurity concentration in field stop region 17 is higher than the impurity concentration in n type region 14.

In n+ substrate 11, an impurity such as for example nitrogen (N) is contained in a substrate made of single crystal silicon carbide. The concentration of the impurity contained in the n+ substrate is, for example, about $5 \times 10^{18}$ cm$^{-3}$. The concentration of an impurity such as nitrogen contained in electric field stop layer 12 is, for example, more than or equal to about $5 \times 10^{17}$ cm$^{-3}$ and less than or equal to about $1 \times 10^{18}$ cm$^{-3}$. The impurity concentration in n type region 14 is, for example, $7 \times 10^{15}$ cm$^{-3}$. N type region 14 is in contact with first p type region 3, second p type region 5b, and guard ring region 16b. Each of first p type region 3, second p type region 5b, and guard ring region 16b is formed to extend from first main surface 10a toward second main surface 10b of silicon carbide layer 10. Each of first p type region 3, second p type region 5b, and guard ring region 16b is formed to be sandwiched between n type regions 14. Further, third p type region 5a is separated from n type region 14 by fourth p type region 16a.

Schottky electrode 50 is provided on first main surface 10a of silicon carbide layer 10, and is in contact with first p type region 3, second p type region 5b, and n type region 14. Schottky electrode 50 forms a Schottky junction with n type region 14. Schottky electrode 50 may form an ohmic junction with second p type region 5b. Schottky electrode 50 is made of, for example, titanium (Ti). Other than titanium, for example, nickel (Ni), titanium nitride (TiN), gold (Au), molybdenum (Mo), tungsten (W), or the like may be used for Schottky electrode 50. That is, Schottky electrode 50 may contain at least one element selected from the group consisting of titanium, molybdenum, nickel, gold, and tungsten.

Insulating layer 20 has third main surface 20a, fourth main surface 20b opposite to third main surface 20a, and side wall surface 20c connecting third main surface 20a and fourth main surface 20b. Side wall surface 20c has a boundary surface 20d connected with fourth main surface 20b. Fourth main surface 20b of insulating layer 20 is in contact with first main surface 10a of silicon carbide layer 10. Insulating layer 20 is made of, for example, silicon dioxide. Insulating layer 20 may be made of silicon nitride or alumina. Schottky electrode 50 is formed to be in contact with side wall surface 20c and a portion of third main surface 20a of insulating layer 20, and to extend from first main surface 10a onto insulating layer 20. Preferably, side wall surface 20c of insulating layer 20 is inclined with respect to first main surface 10a of silicon carbide layer 10. Preferably, side wall surface 20c is formed such that the distance between fourth main surface 20b and side wall surface 20c is reduced toward an inner side. Taper angle θ of insulating layer 20 formed between side wall surface 20c of insulating layer 20 and first main surface 10a of silicon carbide layer 10 is, for example, 40°. Angle θ formed between side wall surface 20c of insulating layer 20 and first main surface 10a of silicon carbide layer 10 is preferably more than or equal to 10° and less than or equal to 60°, and is more preferably more than or equal to 40° and less than or equal to 50°.

Reaction region 2 is in contact with insulating layer 20, Schottky electrode 50, and first p type region 3. Reaction region 2 is formed to be surrounded by insulating layer 20, Schottky electrode 50, and first p type region 3 when viewed in a cross sectional view. Reaction region 2 is in contact with insulating layer 20 at boundary surface 20d of insulating layer 20. Reaction region 2 may be in contact with third p type region 5a included in first p type region 3. Reaction region 2 is configured to contain an element constituting Schottky electrode 50, an element constituting insulating layer 20, silicon, and carbon. For example, reaction region 2 is a region formed by a reaction of titanium, silicon, oxygen, and carbon. When insulating layer 20 is made of silicon dioxide and Schottky electrode 50 is made of titanium, titanium oxide may be formed in a region where insulating layer 20 is in contact with Schottky electrode 50.

Preferably, a contact resistance between third p type region 5a of first p type region 3 of silicon carbide layer 10 and reaction region 2 is less than or equal to 0.1 Ωcm². The contact resistance between reaction region 2 and first p type region 3 may be lower than the contact resistance between Schottky electrode 50 and n type region 14. In other words, reaction region 2 may be a region having a contact resistance with first p type region 3 which is lower than the contact resistance between Schottky electrode 50 and n type region 14.

Figure 3:
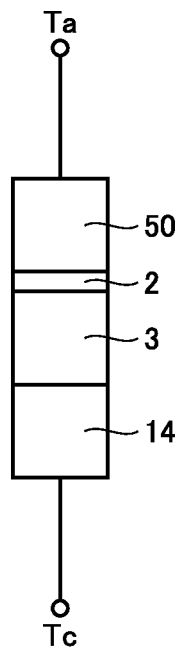
FIG. 3 is a schematic view showing a junction state of a region indicated by a line segment III-III in FIG. 2.

Referring to FIG. 3, reaction region 2 is arranged between an anode terminal Ta and a cathode terminal Tc to be sandwiched between Schottky electrode 50 and first p type region 3. First p type region 3 and n type region 14 form a PN junction. Reaction region 2 is configured to be able to serve as a current path between first p type region 3 and Schottky electrode 50 when the reverse direction voltage is applied.

Figure 4:
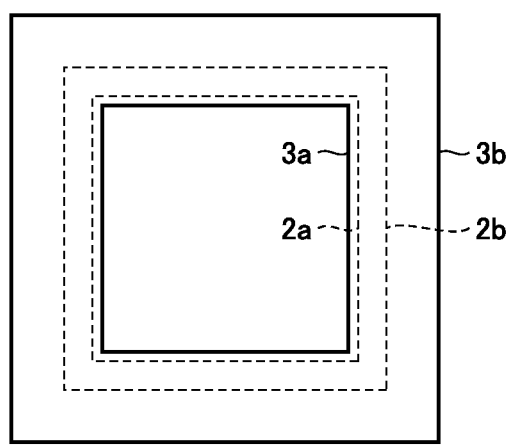
FIG. 4 is a schematic plan view schematically showing the positional relation between a first p type region and a reaction region in the silicon carbide semiconductor device in accordance with one embodiment of the present invention.

Referring to FIG. 4, when viewed in a plan view, reaction region 2 may be located between inner end portion 3a and outer end portion 3b opposite to inner end portion 3a, of first p type region 3. Further, reaction region 2 may be located between an inner end portion 5c and an outer end portion 5d opposite to inner end portion 5c, of third p type region 5a of first p type region 3. Furthermore, reaction region 2 may be formed in an annular shape as shown in FIG. 4, may be formed in a discontinuous annular shape, or may be formed in a linear shape.

Referring back to FIG. 2, in the direction parallel to first main surface 10a of silicon carbide layer 10, a width L3 of first p type region 3 is, for example, more than or equal to about 30 μm and less than or equal to about 40 μm, a width L1 of second p type region 5b and third p type region 5a is, for example, about 2.5 μm, and a width L4 of guard ring region 16b is about 5 μm. Further, in the direction parallel to first main surface 10a, an interval L2 between adjacent second p type regions 5b is, for example, more than or equal to 3 μm and less than or equal to 5 μm, and an interval L5 between first p type region 3 and guard ring region 16b is, for example, about 3 μm. A thickness H of insulating layer 20 is, for example, about 1.0 μm. A width L6 of a portion of third main surface 20a of insulating layer 20 which is in contact with Schottky electrode 50 is, for example, about 10 μm.

Referring to FIG. 1, upper wire 60 is formed in contact with Schottky electrode 50. Upper wire 60 is made of, for example, aluminum, and has a thickness of, for example, about 5 μm. Protective film 70 is formed in contact with upper wire 60, Schottky electrode 50, and third main surface 20a of insulating layer 20. Further, ohmic electrode 30 is arranged in contact with n+ substrate 11. Ohmic electrode 30 is made of, for example, nickel. Furthermore, pad electrode 40 made of, for example, titanium, nickel, silver, gold, or an alloy thereof is arranged in contact with ohmic electrode 30.

Next, a method for manufacturing JBS 1 as a silicon carbide semiconductor device in accordance with one embodiment of the present invention will be described with reference to FIGS. 5 to 10.

Figure 5:
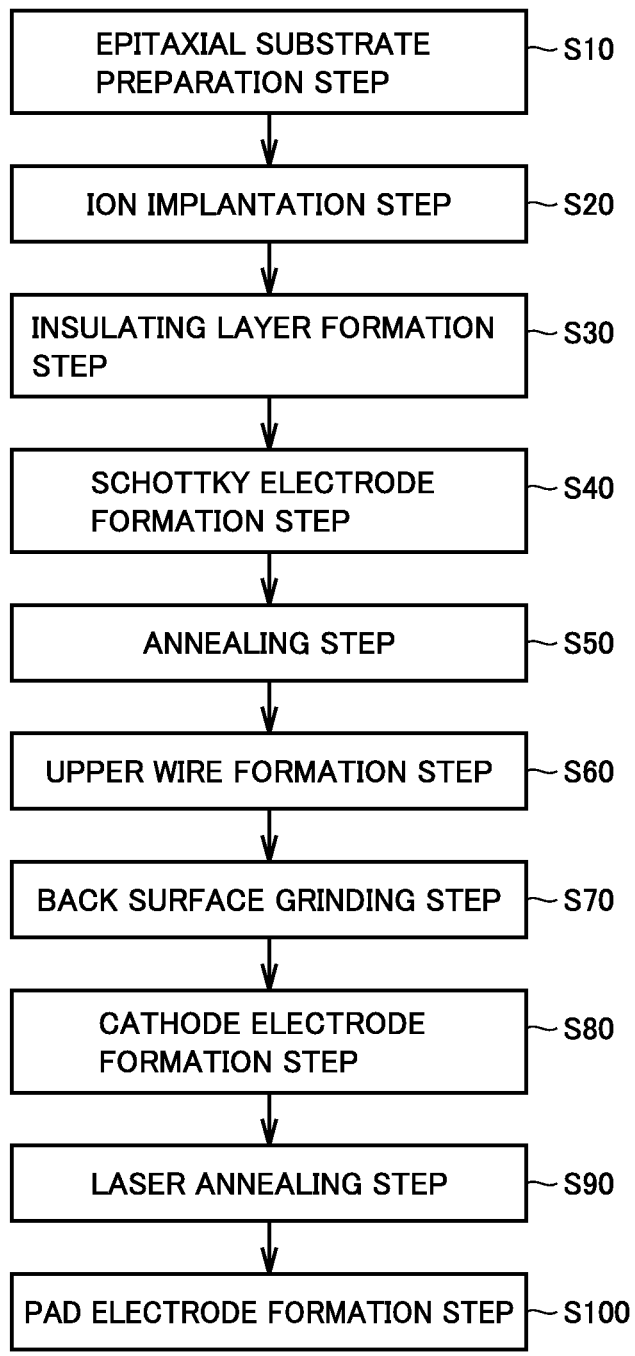
FIG. 5 is a flowchart schematically showing a method for manufacturing the silicon carbide semiconductor device in accordance with one embodiment of the present invention.
Figure 6:
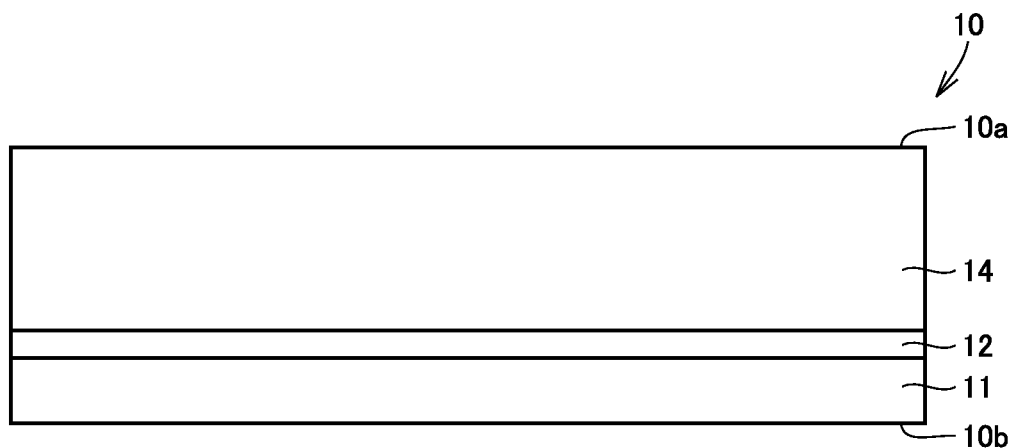
FIG. 6 is a schematic cross sectional view schematically showing a first step of the method for manufacturing the silicon carbide semiconductor device in accordance with one embodiment of the present invention.

Referring to FIG. 6, first, an epitaxial substrate preparation step (S10: FIG. 5) is performed. Specifically, n+ substrate 11 having n type conductivity type is prepared by slicing an ingot (not shown) made of, for example, hexagonal silicon carbide having a polytype of 4H. The n+ substrate contains an impurity such as for example nitrogen (N). The concentration of the impurity contained in the n+ substrate is, for example, about $5 \times 10^{18}$ cm$^{-3}$.

Next, electric field stop layer 12 and n type region 14 are formed on n+ substrate 11 by epitaxial growth. Electric field stop layer 12 is a silicon carbide layer having n type. Thereafter, n type region 14 having n type conductivity type is formed on electric field stop layer 12. The concentration of an impurity such as nitrogen contained in n type region 14 is, for example, about $7 \times 10^{15}$ cm$^{-3}$. N type region 14 has a thickness of, for example, about 15 μm.

Figure 7:
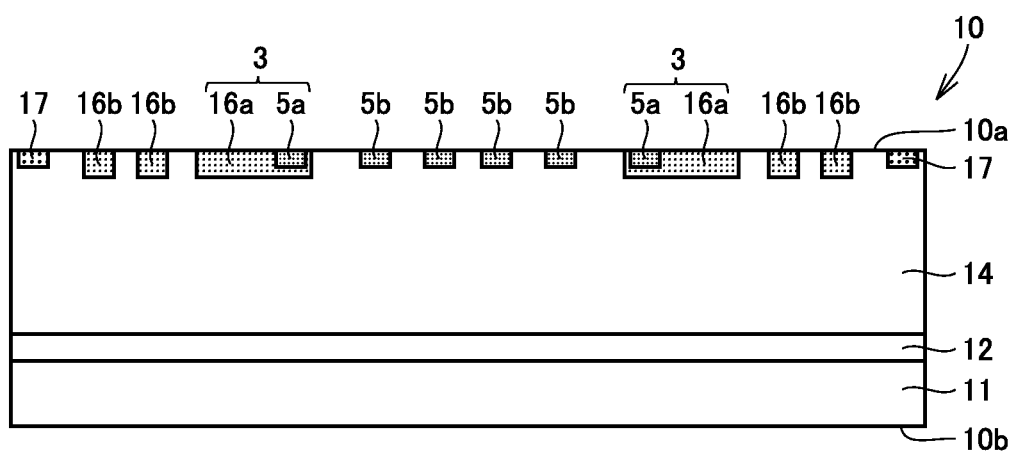
FIG. 7 is a schematic cross sectional view schematically showing a second step of the method for manufacturing the silicon carbide semiconductor device in accordance with one embodiment of the present invention.

Next, an ion implantation step (S20: FIG. 5) is performed. Referring to FIG. 7, by implanting Al (aluminum) ions, for example, into n type region 14, first p type region 3, second p type region 5b, and guard ring region 16b are formed to be exposed at first main surface 10a of silicon carbide layer 10. First p type region 3 includes third p type region 5a, and fourth p type region 16a formed to surround third p type region 5a. Each of second p type region 5b and third p type region 5a has an impurity concentration of, for example, about $1 \times 10^{19}$ cm$^{-3}$. Each of fourth p type region 16a and guard ring region 16b has an impurity concentration of, for example, more than or equal to about $1 \times 10^{17}$ cm$^{-3}$ and less than or equal to about $3 \times 10^{17}$ cm$^{-3}$. Similarly, by implanting P (phosphorus) or the like, for example, into n type region 14, field stop region 17 having n type is formed.

Next, an activation annealing step is performed. Specifically, the impurities which have been introduced in the above ion implantation step are activated for example by heating silicon carbide layer 10 at a temperature of about 1800° C. in an atmosphere of an inert gas such as argon. Thereby, desired carriers are generated in the regions into which the impurities have been introduced.

Figure 8:
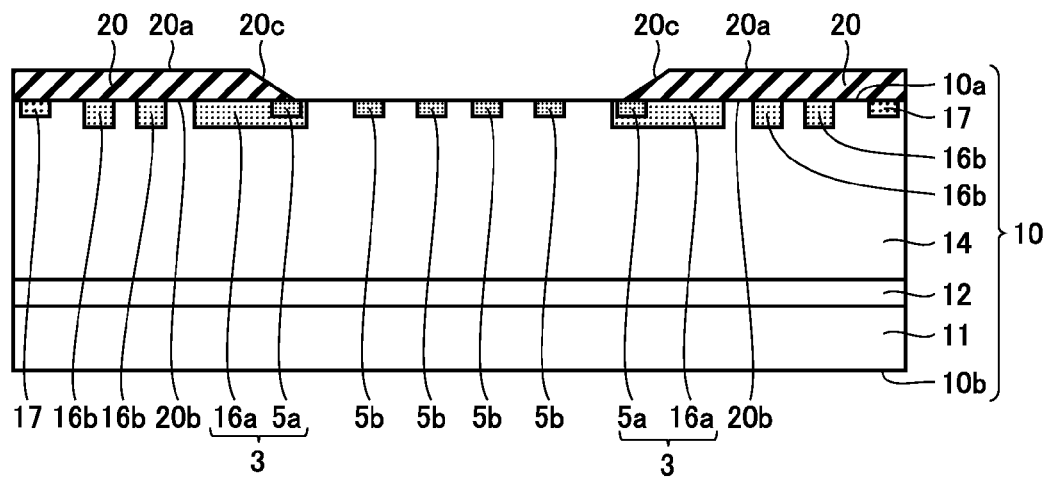
FIG. 8 is a schematic cross sectional view schematically showing a third step of the method for manufacturing the silicon carbide semiconductor device in accordance with one embodiment of the present invention.

Next, an insulating layer formation step (S30: FIG. 5) is performed. Referring to FIG. 8, insulating layer 20 made of, for example, silicon dioxide is formed in contact with first main surface 10a of silicon carbide layer 10. Insulating layer 20 may be formed for example by CVD (Chemical Vapor Deposition). Thereafter, an opening made of side wall surface 20c is formed in insulating layer 20 for example by a photolithographic method, such that the central portion of first main surface 10a of silicon carbide layer 10 is exposed from insulating layer 20. Preferably, insulating layer 20 is formed such that side wall surface 20c of insulating layer 20 is inclined with respect to first main surface 10a of silicon carbide layer 10. Preferably, angle θ formed between side wall surface 20c of insulating layer 20 and first main surface 10a of silicon carbide layer 10 (see FIG. 2) is more than or equal to 10° and less than or equal to 60°.

Next, a Schottky electrode formation step (S40: FIG. 5) is performed. Specifically, referring to FIG. 9, Schottky electrode 50 containing for example titanium (Ti), nickel (Ni), molybdenum (Mo), tungsten (W), or the like is formed in contact with first p type region 3, second p type region 5b, n type region 14, side wall surface 20c of insulating layer 20, and a portion of third main surface 20a.

Figure 9:
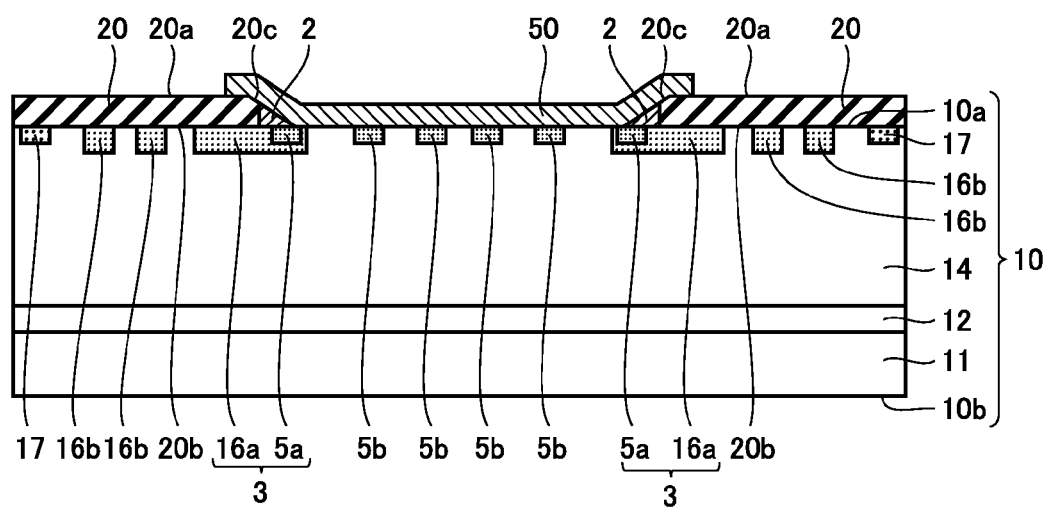
FIG. 9 is a schematic cross sectional view schematically showing a fourth step of the method for manufacturing the silicon carbide semiconductor device in accordance with one embodiment of the present invention.

Next, an annealing step (S50: FIG. 5) is performed. Referring to FIG. 9, silicon carbide layer 10 having insulating layer 20 and Schottky electrode 50 formed thereon is subjected to annealing at a temperature of, for example, about 500° C. The annealing temperature is preferably more than or equal to about 400° C. and less than or equal to about 700° C., and is more preferably more than or equal to about 350° C. and less than or equal to about 500° C. By annealing silicon carbide layer 10 having insulating layer 20 and Schottky electrode 50 formed thereon, reaction region 2 is formed in a region where Schottky electrode 50, first p type region 3, and insulating layer 20 are in contact with each other. Reaction region 2 is formed to include a boundary 2a between fourth main surface 20b and side wall surface 20c of insulating layer 20. Reaction region 2 may be formed in contact with third p type region 5a included in first p type region 3. Reaction region 2 is configured to contain an element constituting Schottky electrode 50, an element constituting insulating layer 20, silicon, and carbon. For example, reaction region 2 is a region formed by a reaction of titanium, silicon, oxygen, and carbon.

Figure 10:
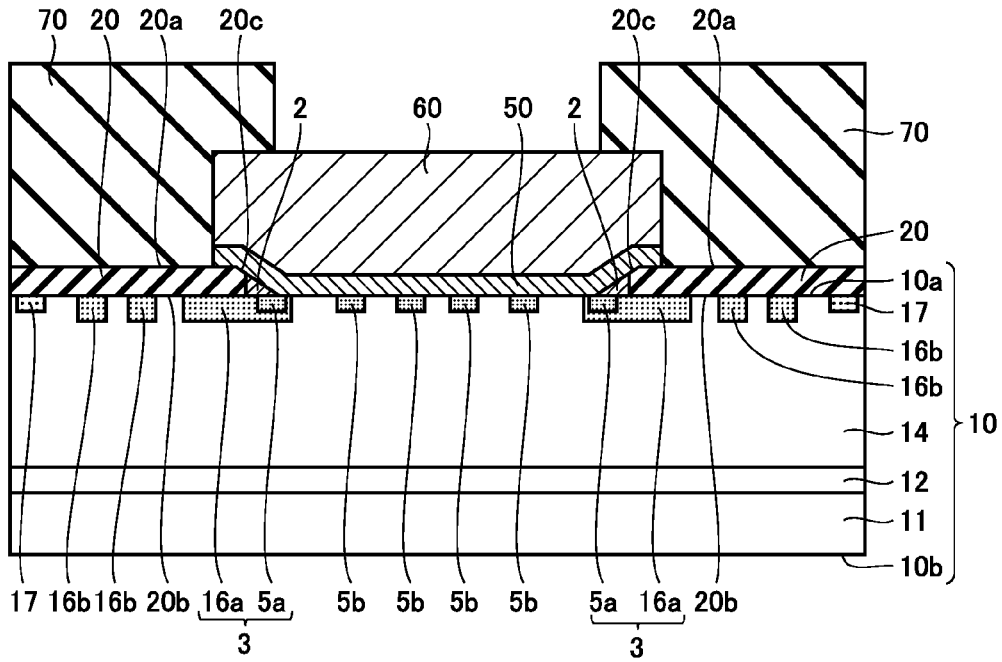
FIG. 10 is a schematic cross sectional view schematically showing a fifth step of the method for manufacturing the silicon carbide semiconductor device in accordance with one embodiment of the present invention.

Next, an upper wire formation step (S60: FIG. 5) is performed. Referring to FIG. 10, for example, upper wire 60 made of aluminum is formed on Schottky electrode 50. Thereafter, protective film 70 in contact with upper wire 60, Schottky electrode 50, and the third main surface of insulating layer 20 is formed for example by the CVD method. Protective film 70 is made of, for example, silicon dioxide, silicon nitride, polyimide, or a lamination film thereof.

Next, a back surface grinding step (S70: FIG. 5) is performed. The thickness of silicon carbide layer 10 is reduced, for example, by grinding second main surface 10b of silicon carbide layer 10. The thickness of silicon carbide layer 10 after grinding is, for example, more than or equal to about 100 µm and less than or equal to about 150 µm.

Next, a cathode electrode formation step (S80: FIG. 5) is performed. Cathode electrode 30 made of, for example, nickel is formed in contact with second main surface 10b of silicon carbide layer 10.

Next, a laser annealing step (S90: FIG. 5) is performed. For example, laser beams are emitted to cathode electrode 30 formed on second main surface 10b in the above cathode electrode formation step. As a laser, for example, a YAG laser having a wavelength of 355 nm is used. Cathode electrode 30 is heated to about 1000° C. by emitting laser beams to cathode electrode 30. Thereby, ohmic electrode 30 which forms an ohmic junction with silicon carbide layer 10 is formed.

Next, a pad electrode formation step (S100: FIG. 5) is performed. Pad electrode 40 made of, for example, titanium, nickel, silver, or an alloy thereof is formed in contact with ohmic electrode 30. Thereby, JBS 1 as the silicon carbide diode shown in FIG. 1 is completed.

Next, the function and effect of JBS 1 in accordance with the present embodiment will be described.

JBS 1 in accordance with the present embodiment has reaction region 2 which is in contact with insulating layer 20, Schottky electrode 50, and p type region 3, and reaction region 2 contains an element constituting Schottky electrode 50, an element constituting insulating layer 20, silicon, and carbon. This can alleviate concentration of an electric field on reaction region 2 where insulating layer 20, Schottky electrode 50, and p type region 3 of silicon carbide layer 10 are in contact with each other. Thus, this can suppress over-time deterioration of insulation properties of insulating layer 20. As a result, this can suppress over-time deterioration of the breakdown voltage of JBS 1. Further, since reaction region 2 serves as a current path even when a high voltage is applied instantaneously, a stable breakdown phenomenon can be obtained. Furthermore, a high breakdown voltage can be obtained by providing p type region 3 in contact with reaction region 2 in silicon carbide layer 10.

Further, according to JBS 1 in accordance with the present embodiment, side wall surface 20c of insulating layer 20 is inclined with respect to first main surface 10a of silicon carbide layer 10. Since this can facilitate formation of reaction region 2, this can effectively alleviate concentration of the electric field on reaction region 2 where insulating layer 20, Schottky electrode 50, and p type region 3 of silicon carbide layer 10 are in contact with each other.

Furthermore, according to JBS 1 in accordance with the present embodiment, angle θ formed between side wall surface 20c and first main surface 10a is more than or equal to 10° and less than or equal to 60°. Since this can reduce a leakage current in reaction region 2, this can improve the breakdown voltage of JBS 1. If angle θ is less than 10°, the leakage current is increased and the breakdown voltage of JBS 1 is reduced. On the other hand, if angle θ is more than 60°, it is difficult to facilitate the formation of reaction region 2. By setting angle θ to more than or equal to 10° and less than or equal to 60°, a reduction in the breakdown voltage of JBS 1 can be suppressed, and the formation of reaction region 2 can be facilitated.

Furthermore, according to JBS 1 in accordance with the present embodiment, the contact resistance between p type region 3 of silicon carbide layer 10 and reaction region 2 is less than or equal to 0.1 $\Omega cm^2$. This can alleviate concentration of the electric field on reaction region 2 where insulating layer 20, Schottky electrode 50, and p type region 3 of silicon carbide layer 10 are in contact with each other. As a result, this can effectively suppress over-time deterioration of the breakdown voltage of JBS 1.

Furthermore, according to JBS 1 in accordance with the present embodiment, when viewed in a plan view, p type region 3 includes inner end portion 3a and outer end portion 3b opposite to inner end portion 3a. When viewed in a plan view, reaction region 2 is located between inner end portion 3a and outer end portion 3b. This can improve the breakdown voltage of JBS 1.

Furthermore, JBS 1 in accordance with the present embodiment further includes guard ring region 16b arranged to surround p type region 3 when viewed in a plan view. This can effectively improve the breakdown voltage of JBS 1.

Furthermore, according to JBS 1 in accordance with the present embodiment, insulating layer 20 contains silicon dioxide. Thereby, reaction region 2 in contact with silicon carbide layer 10 with a low resistance can be formed effectively.

Furthermore, according to JBS 1 in accordance with the present embodiment, Schottky electrode 50 contains at least one element selected from the group consisting of titanium, molybdenum, nickel, gold, and tungsten. Thereby, reaction region 2 in contact with silicon carbide layer 10 with a low resistance can be formed effectively.

EXAMPLE

Next, an example will be described.

First, JBSes in a first example, a second example, and a third example were prepared. The JBS in the first example is a JBS having the same structure as the structure described in the embodiment. That is, the JBS in the first example has first p type region 3, guard ring region 16b, and reaction region 2, and angle θ formed between side wall surface 20c of insulating layer 20 and first main surface 10a of silicon carbide layer 10 is 40°. The JBS in the second example is different from the JBS in the first example in not having first p type region 3 and guard ring region 16b. Other than that difference, the JBS in the second example is the same as the JBS in the first example. The JBS in the third example is different from the JBS in the first example in not having first p type region 3 and guard ring region 16b, and in that angle θ formed between side wall surface 20c of insulating layer 20 and first main surface 10a of silicon carbide layer 10 is 15°. Other than those differences, the JBS in the third example is the same as the JBS in the first example.

Figure 11:
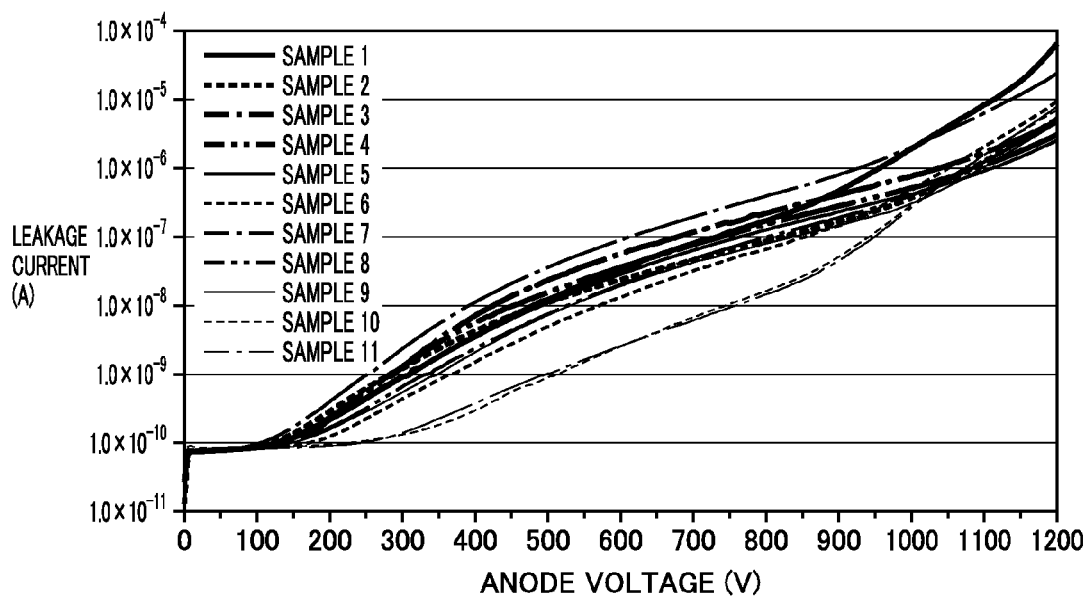
FIG. 11 is a view showing the relation between leakage current and anode voltage in a silicon carbide semiconductor device in accordance with a first example.

Referring to FIG. 11, the relation between leakage current and anode voltage in the JBS in the first example will be described.

As shown in FIG. 11, the leakage current increases with an increase in the anode voltage applied to the JBS in the first example. Different types of lines indicate samples having different identification numbers manufactured by the same manufacturing method. If a leakage current of the JBS of less than or equal to $1.0 \times 10^{-4}$ A is considered as a basis for the breakdown voltage, in the JBS in the first example, although the samples have variations, the leakage current of the JBS is less than or equal to $1.0 \times 10^{-4}$ A at an anode voltage of 1200 V, even for the sample having the largest leakage current. That is, it was confirmed that the breakdown voltage of the JBS in the first example is more than or equal to 1200 V.

Next, referring to FIGS. 12 and 13, the relation between leakage current and anode voltage in the JBSes in the second and third examples will be described.

Figure 12:
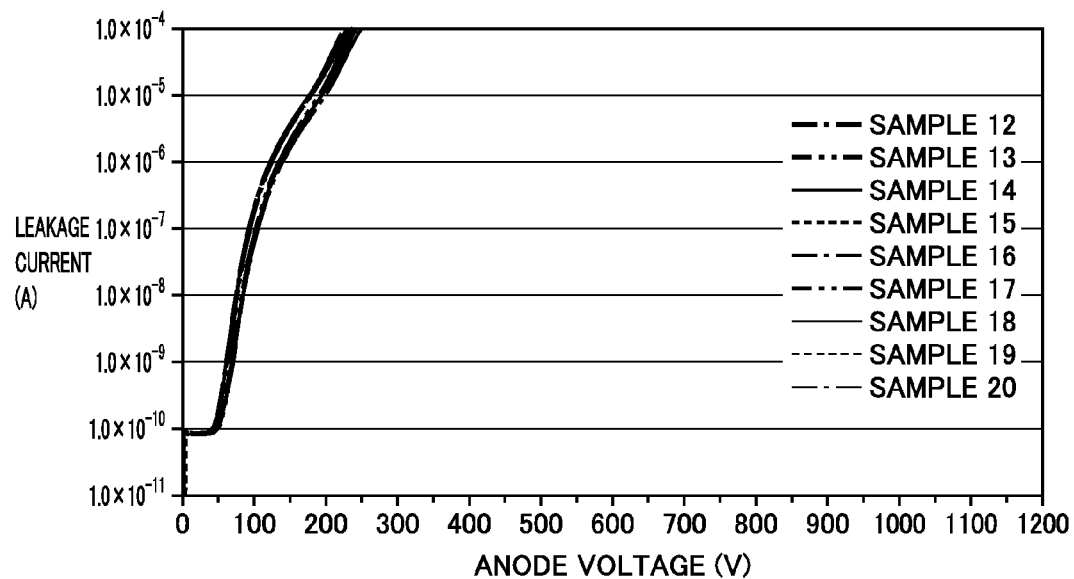
FIG. 12 is a view showing the relation between leakage current and anode voltage in a silicon carbide semiconductor device in accordance with a second example.
Figure 13:
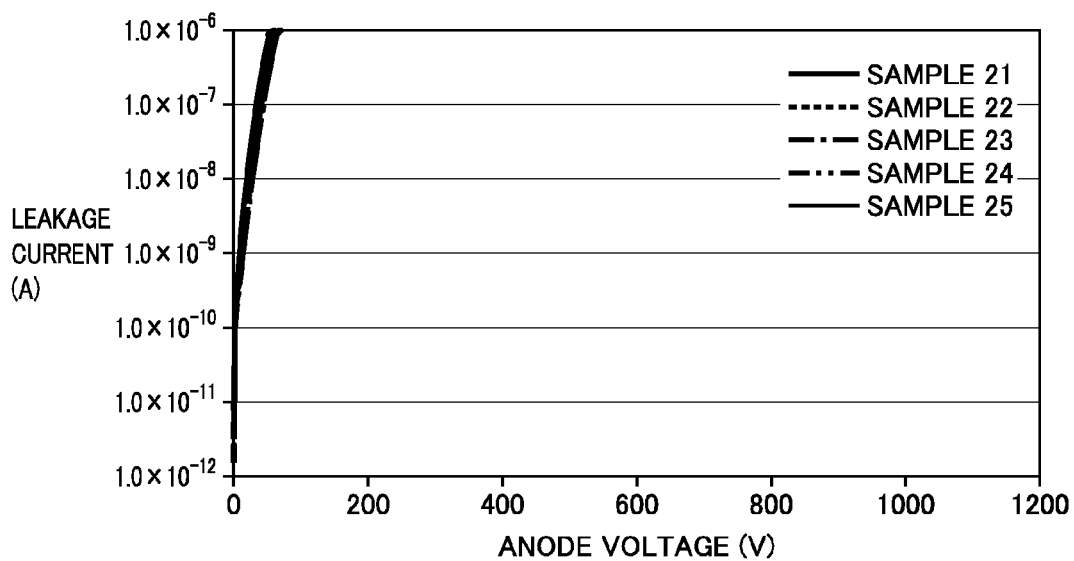
FIG. 13 is a view showing the relation between leakage current and anode voltage in a silicon carbide semiconductor device in accordance with a third example.

As shown in FIG. 12, the leakage current drastically increases with an increase in the anode voltage applied to the JBS in the second example. For example, in the JBS in the second example, the leakage current of the JBS reaches $1.0 \times 10^{-6}$ A at an anode voltage of more than or equal to about 100 V and less than or equal to about 140 V. On the other hand, referring to FIG. 13, in the JBS in the third example, the leakage current of the JBS reaches $1.0 \times 10^{-6}$ A at an anode voltage of more than or equal to about 40 V and less than or equal to about 70 V. That is, the breakdown voltage of the JBS in the second example, in which angle θ formed between side wall surface 20c of insulating layer 20 and first main surface 10a of silicon carbide layer 10 is 40°, is higher than the breakdown voltage of the JBS in the third example, in which angle θ formed between side wall surface 20c of insulating layer 20 and first main surface 10a of silicon carbide layer 10 is 15°. Based on the above result, it was confirmed that the breakdown voltage of the JBS is increased with an increase in angle θ formed between side wall surface 20c of insulating layer 20 and first main surface 10a of silicon carbide layer 10. From another viewpoint, when comparison was made at the same anode voltage, it was confirmed that the JBS having larger angle θ formed between side wall surface 20c of insulating layer 20 and first main surface 10a of silicon carbide layer 10 has a smaller leakage current than that of the JBS having smaller angle θ formed between side wall surface 20c of insulating layer 20 and first main surface 10a of silicon carbide layer 10.

It should be understood that the embodiment and the example disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

1: silicon carbide semiconductor device (JBS); 2: reaction region; 2a: boundary; 3: p type region (first p type region); 3a, 5c: inner end portion; 3b, 5d: outer end portion; 5a: third p type region; 5b: second p type region; 17: field stop region; 10: silicon carbide layer; 10a: first main surface; 10b: second main surface; 11: substrate; 12: electric field stop layer; 14: n type region; 16a: fourth p type region; 16b: guard ring region; 20: insulating layer; 20a: third main surface; 20b: fourth main surface; 20c: side wall surface; 20d: boundary surface; 30: ohmic electrode (cathode electrode); 40: pad electrode; 50: Schottky electrode; 60: upper wire; 70: protective film; L1, L3, L4, L6: width; L2, L5: interval; Ta: anode terminal; Tc: cathode terminal.

The invention claimed is:

1. A silicon carbide semiconductor device, comprising
a silicon carbide layer which has a first main surface and a second main surface opposite to said first main surface, and includes a p type region in contact with said first main surface and an n type region in contact with said p type region and said first main surface;
an insulating layer which has a third main surface, a fourth main surface opposite to said third main surface, and a side wall surface connecting said third main surface and said fourth main surface, said insulating layer being in contact with said first main surface at said fourth main surface;
a Schottky electrode which is in contact with said first main surface and said side wall surface; and
a reaction region which is in contact with said insulating layer, said Schottky electrode, and said p type region, wherein
said reaction region contains an element constituting said Schottky electrode, an element constituting said insulating layer, silicon, and carbon, and
wherein all of said side wall surface and a portion of said third main surface are covered by a continuous portion of said Schottky electrode.

2. The silicon carbide semiconductor device according to claim 1, wherein said side wall surface of said insulating layer is inclined with respect to said first main surface of said silicon carbide layer.

3. The silicon carbide semiconductor device according to claim 2, wherein an angle formed between said side wall surface and said first main surface is more than or equal to 10° and less than or equal to 60°.

4. The silicon carbide semiconductor device according to claim 1, wherein a contact resistance between said p type region of said silicon carbide layer and said reaction region is less than or equal to $0.1\ \Omega\text{cm}^2$.

5. The silicon carbide semiconductor device according to claim 1, wherein
when viewed in a plan view, said p type region includes an inner end portion and an outer end portion opposite to said inner end portion, and
when viewed in a plan view, said reaction region is located between said inner end portion and said outer end portion.

6. The silicon carbide semiconductor device according to claim 1, further comprising a guard ring region arranged to surround said p type region when viewed in a plan view.

7. The silicon carbide semiconductor device according to claim 1, wherein said insulating layer contains silicon dioxide.

8. The silicon carbide semiconductor device according to claim 1, wherein said Schottky electrode contains at least one element selected from the group consisting of titanium, molybdenum, nickel, gold, and tungsten.

* * * * *